US005772904A

United States Patent [19]

Kim

[11] Patent Number: 5,772,904

[45] Date of Patent: Jun. 30, 1998

[54] FIELD EMISSION DISPLAY AND FABRICATING METHOD THEREFOR

[75] Inventor: Jong-min Kim, Jongro-gu, Rep. of Korea

[73] Assignee: Samsung Display Devices Co., Ltd., Suwon, Rep. of Korea

[21] Appl. No.: 685,826

[22] Filed: Jul. 25, 1996

Related U.S. Application Data

[62] Division of Ser. No. 487,042, Jun. 7, 1995.

[30] Foreign Application Priority Data

Mar. 28, 1995 [KR] Rep. of Korea ........................ 95-6749

[51] Int. Cl.[6] .............................. H01L 21/00; B44C 1/22

[52] U.S. Cl. ................................. 216/24; 216/25; 216/67

[58] Field of Search ................................. 216/24, 25, 41, 216/67; 437/905, 906; 313/309, 495; 445/24

[56] References Cited

U.S. PATENT DOCUMENTS 5,449,970 9/1995 Kumar et al. ........................... 313/495

*Primary Examiner*—William Powell
*Attorney, Agent, or Firm*—Foley & Lardner

[57] ABSTRACT

A field emission display having a diamond thin film having a low work function due to its affinity for electrons used for forming a micro-tip. Electron emitting micro-tips are manufactured using diamond or diamond-like carbon which have a low work function due to their affinity for electrons, and thereby facilitate electron emission at a very low gate voltage. Manufacturing a flat micro-tip allows uniform tips to be formed so that a large device can be easily fabricated.

14 Claims, 3 Drawing Sheets

FIELD EMISSION DISPLAY AND FABRICATING METHOD THEREFOR

This application is a divisional of application Ser. No. 08/487,042, filed Jun. 7, 1995.

BACKGROUND OF THE INVENTION

1. Field of the Invention

The present invention relates to a field emission display with a diamond thin film in which the diamond thin film, having a low work function due to its electron affinity, is used for forming a micro-tip, and the fabricating method therefor.

2. Description of Related Art

Referring to FIG. 1, the structure of a conventional vertical field emission display will be described.

The conventional vertical field emission display includes a rear glass substrate 1, a cathode 2 formed on glass substrate 1, a field emitting micro-tip 2' formed on cathode 2, an insulating layer 3 formed on cathode 2 so as to have a hole 3' surrounding micro-tip 2', a gate 4 formed on insulating layer 3 so as to have an aperture 4' which allows field emission from the upper portion of micro-tip 2', an anode 5 for attracting electrons emitted from micro-tip 2' to be impinged on a fluorescent layer 6 at a known kinetic energy, and a front glass substrate 1' on which anode 5 is formed.

In the vertical field emission display shown in FIG. 1, the micro-tip should be extremely sharp. Also, since the flow of the electrons emitted from the micro-tip 2' depends on the size of the gate aperture 4', the micro-tip 2' has to be several tens of nanometers in size. As a result, an advanced micro-fabrication technique of a submicron unit is necessary in the etching process for forming the micro-tip 2' and the gate aperture 4'. Thus, there are problems such as non-uniformity throughout the fabrication process and a lowered yield in fabricating large devices. If the aperture 4' of the gate is larger, a higher level of bias voltage must be applied to the gate. Moreover, since micro-tips of vertical field emission displays generally have a relatively high work function, a higher voltage is required for driving the gate electrode.

SUMMARY OF THE INVENTION

To solve the aforementioned problems related with conventional field emission displays, it is an object of the present invention to provide a field emission display having a micro-tip that has a low work function such that it can emit electrons at a low driving voltage level, and that is capable of attaining a high yield even when fabricating a large device, and the fabrication method thereof.

To accomplish the above object, the field emission display according to the present invention comprises: a rear substrate; a striped cathode formed on the rear substrate to a predetermined thickness; a micro-tip pedestal formed on the cathode to a predetermined height using a predetermined material; a flat micro-tip formed on the micro-tip pedestal to a predetermined thickness using a material having a work function below a predetermined value; an insulating layer having a hole surrounding the micro-tip pedestal, and formed on the cathode with a predetermined height lower than the micro-tip; a gate having an aperture at a predetermined space from the micro-tip pedestal formed on the insulating layer with a predetermined height lower than the micro-tip; and a front substrate having an opposing surface opposed to and separate from the rear substrate by a predetermined distance and having a striped anode formed on the opposing surface thereof.

In the present invention, the micro-tip is preferably formed by depositing a layer of diamond or diamond-like carbon (DLC) coating to a thickness between about 0.5 to 1 μm. The micro-tip pedestal is preferably formed to a thickness of between about 1.5 to 2 μm. Also, the micro-tip pedestal is preferably formed of amorphous silicon.

In another embodiment of the present invention, a field emission display comprises: a rear substrate; a striped cathode formed on the rear substrate to a predetermined thickness; a micro-tip pedestal formed on the cathode to a predetermined height using a predetermined material; a cone-shaped micro-tip having a sharp end formed on the micro-tip pedestal using material having a work function below a predetermined value; an insulating layer having a hole surrounding the micro-tip and micro-tip pedestal, and formed on the cathode with a predetermined height that is lower than the height of the micro-tip pedestal; a gate, having an aperture at a predetermined space from the micro-tip, formed on the insulating layer and having a height that is the same as the height of the micro-tip; and a front substrate opposed to the rear substrate at a predetermined distance and having a striped anode formed on a surface thereof.

In the present invention, the micro-tip is preferably formed by depositing a layer of diamond or diamond-like carbon coating having a thickness between about 0.5 to 1 μm. The micro-tip pedestal is preferably formed to a thickness of between about 1.5 to 2 μm. Also, the micro-tip pedestal is preferably formed of amorphous silicon.

In another embodiment of the present invention, there is provided, a method for fabricating a field emission display comprising the steps of: forming a cathode pattern by depositing a cathode layer on a substrate; forming an amorphous silicon layer by depositing amorphous silicon on the cathode pattern; forming a thin film or coating of diamond or diamond-like carbon on the amorphous silicon layer; forming a mask by forming a mask layer on the thin film and etching and patterning the mask layer, forming a tip by isotropically etching the thin film using the mask; forming a tip pedestal by etching the amorphous silicon layer; forming an insulating layer by depositing insulation material around the tip pedestal; forming a gate layer by depositing a metal on the insulating layer; and etching the mask to remove the insulation material and gate layer deposited on the tip. A diamond-like carbon film may be formed or a diamond thin film may be formed.

The amorphous silicon layer forming step is preferably performed by an electron beam deposition method or sputtering method.

Also, the diamond thin film or diamond-like carbon film forming step is preferably performed by a plasma enhanced chemical vapor deposition method.

The mask forming step is preferably performed by a lift-off method or chemical etching method.

$SF_6$—$O_2$ plasma is preferably adopted in the isotropic etching process of the diamond tip forming step.

The diamond tip pedestal forming step preferably includes the isotropical etching stage using $SF_6$—$O_2$ plasma and the anisotropical etching stage using $CF_4$—$O_2$ plasma.

The insulating layer forming step is preferably performed by an electron-beam deposition method adopting a self-aligned mask.

The mask is preferably removed by soaking the mask in a metal chemical etchant solution and applying ultrasonic vibration thereto.

A step of etching the insulating layer to a predetermined level using a buffered oxide etchant is preferably included after the mask etching step.

BRIEF DESCRIPTION OF THE DRAWINGS

The above objects and advantages of the present invention will become more apparent by describing in detail preferred embodiments thereof with reference to the attached drawings, in which.

DETAILED DESCRIPTION OF THE PREFERRED EMBODIMENTS

Figure 1:
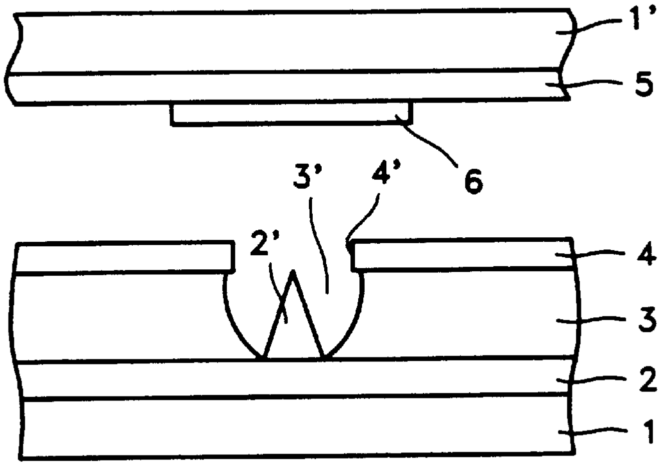
FIG.1(PRIOR ART)
FIG. 1 is a vertical, cross-sectional view of a conventional field emission display.
Figure 2:
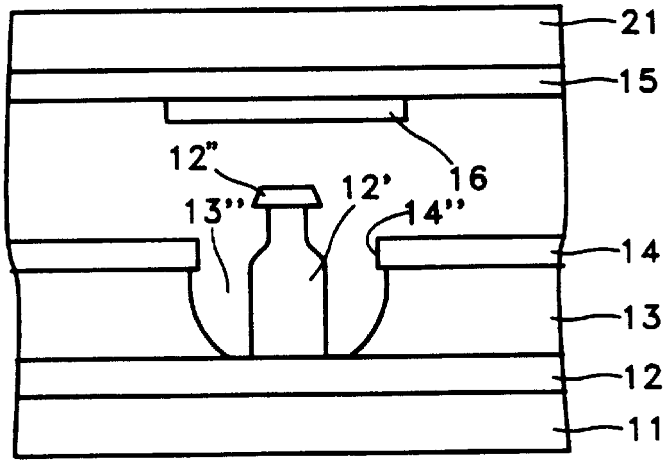
FIG. 2 is a vertical, cross-sectional view of a field emission display having a flat diamond tip according to an embodiment of the present invention.
Figure 3:
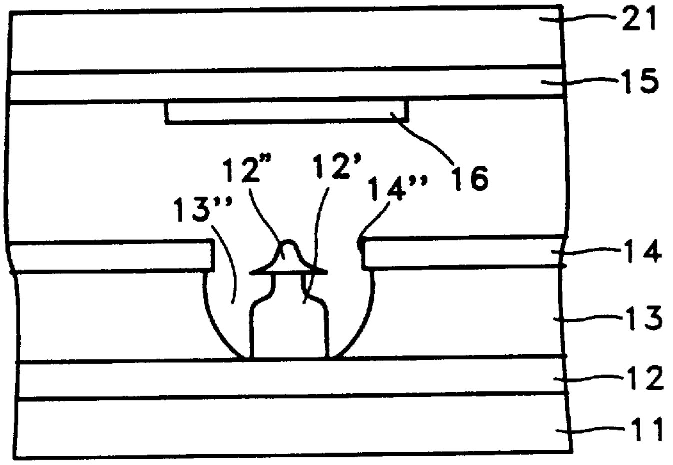
FIG. 3 is a vertical, cross-sectional view of a fields emission display having a sharp diamond tip according to another embodiment of the present invention.

Referring to FIGS. 2 and 3, the structure of the field emission display according to the present invention comprises a striped cathode 12, an insulating layer 13 having a hole 13", and a chrome gate 14 having an aperture 14" sequentially deposited on a glass substrate 11. An electron emitting diamond tip 12" and diamond tip pedestal 12" are formed on the cathode at the bottom of hole 13". Here, the diamond tip 12" is either flat or sharp as illustrated in FIGS. 2 and 3, respectively. The flat or sharp diamond tip 12" will be described more fully below. Above the diamond tip pedestal 12', there is provided a front substrate 21 opposed to the diamond tip 12" at a predetermined distance and having a striped anode 15 on a surface thereof and a fluorescent layer 16 on a surface of striped anode 15. The striped pattern of the anode crisscrosses the striped pattern of the cathode 12. Preferably, the striped pattern of the anode 15 is perpendicular with the striped pattern of the cathode 12.

In the field emission display having the aforementioned structure, cathode 12 is formed by depositing a layer of metal to a thickness of about 0.5 $\mu$m, the diamond tip pedestal 12' is formed by depositing a layer of amorphous silicon to a thickness of between about 1.5 to 2 $\mu$m, and the diamond tip 12" is formed by forming and etching a thin film having a thickness between about 5,000 to 10,000 Å thick.

In a field emission display using a flat diamond tip 12" as shown in FIG. 2, a problem arises if the flat diamond tip 12" is not formed higher than the gate 14 since a strong electrical field is formed therebetween and causes current leakage to the gate 14. In order to prevent the current leakage, in a first embodiment of the present invention, the diamond tip pedestal 12' is formed to be higher than gate 14, and gate 14 is driven at a negative voltage, thereby facilitating electron emission and reducing current leakage.

Alternatively, in a second embodiment, rather than increasing the height of the diamond tip pedestal 12', a sharp diamond tip 12", as shown in FIG. 3, is used and a field enhancement effect is attained. The device illustrated in FIG. 3 can be fabricated more easily, without raising the pedestal, than the device using the flat diamond tip 12" shown in FIG. 2. In the second embodiment, the diamond thin film is etched by plasma etching after narrowing the width of the film to obtain a sharp diamond tip.

Figure 4A:
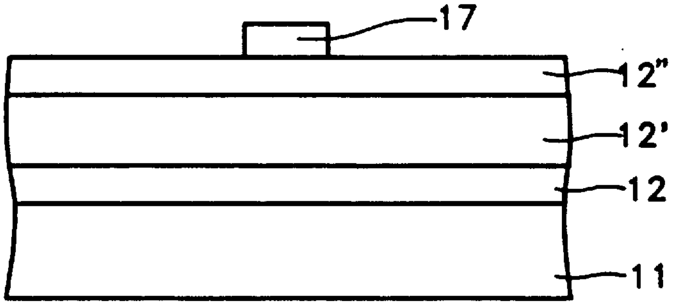
FIGS. 4A to 4E are vertical, cross-sectional views showing a method for fabricating a field emission display having a sharp diamond tip according to another embodiment of the present invention.
Figure 4B:
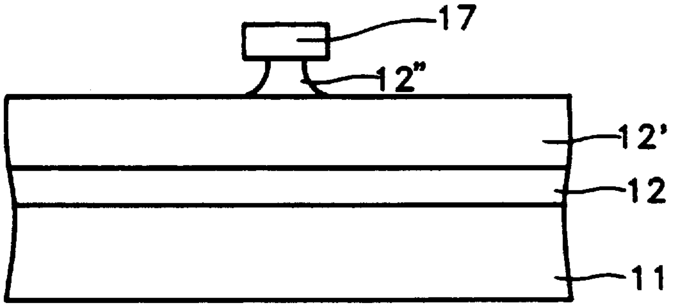
Figure 4C:
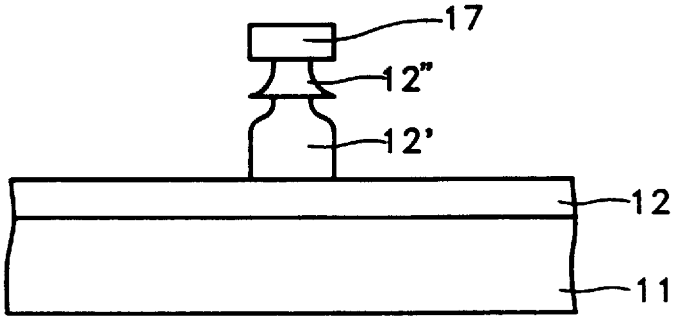
Figure 4D:
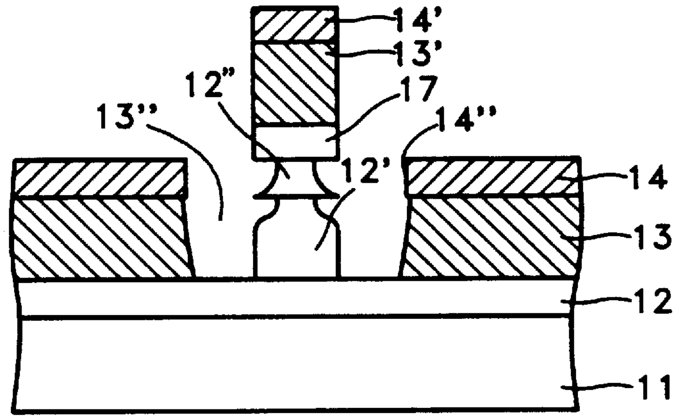
Figure 4E:
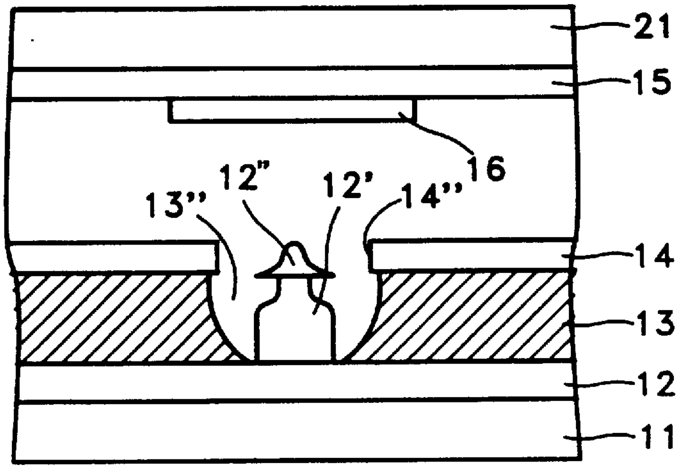

The method for fabricating the field emission display having the aforementioned structure will be described with reference to FIGS. 4A to 4E, in which FIG. 4A is a vertical cross-sectional view, showing a chrome mask formation. FIG. 4B is a vertical cross-sectional view showing a diamond tip formation by plasma etching. FIG. 4C is a vertical, cross-sectional view, showing a pedestal formation by plasma etching. FIG. 4D is a vertical, cross-sectional view showing insulating layer and metal deposition, and FIG. 4E is a vertical cross-sectional view showing a field emission display that is finally completed by installing an anode plate on which fluorescent material is coated.

First, as shown in FIG. 4A, a metal is deposited on a substrate 11 and is patterned to form a striped cathode pattern 12. Amorphous silicon is deposited on cathode pattern 12 to a thickness of about 1.5 to 2 $\mu$m to form an amorphous silicon layer 12' using an electron-beam deposition method or sputtering method. Thereafter, a diamond thin film or a diamond-like carbon film 12" is deposited on the amorphous silicon layer 12' to a thickness of about 5,000 to 10,000 Å using a plasma enhanced chemical vapor deposition method. Above the diamond thin film or diamond-like carbon film 12", there is formed a chrome mask 17 using either a lift-off method or chemical etching.

Next, the diamond thin film 12" is isotropically etched using the chrome mask 17 to form a diamond tip 12", as shown in FIG. 4B. At this time, the diamond thin film is isotropically etched using $SF_6$—$O_2$ plasma. According to the degree of isotropic etching, the micro-tip 12" is formed as a flat micro-tip or a sharp micro-tip. In other words, the more the thin film 12" is etched, the sharper the micro-tip becomes.

As shown in FIG. 4C, the amorphous silicon layer 12' is first isotropically etched using the $SF_6$—$O_2$ plasma to the required degree, where a low etching selectivity to the diamond or silicon is preferred, and is then anisotropically etched using $CF_4$—$O_2$ plasma, thereby forming a bottle-shaped diamond tip pedestal 12'.

Next, insulation material and metal is deposited around the diamond tip pedestal 12' using an electron beam deposition device to form an insulating layer 13 and a gate 14, respectively, as shown in FIG. 4D. At this time, the chrome mask 17 has become a self-aligned mask.

Then, the chrome mask 17 is etched to remove the insulation material 13' and gate layer 14' deposited on the diamond tip 12", thereby exposing the diamond tip 12" as shown in FIG. 4E. The etching of the chrome mask 17 is performed by applying an ultrasonic vibration with the substrate being soaked in a metal chemical etchant solution.

Thereafter, the substrate is put into a buffered oxide etchant to etch the insulating layer slightly. Then, a front substrate 21, having a surface on which a striped anode 15 is formed, is disposed opposite the rear substrate 11 on which diamond tip 12" is formed, at a predetermined distance. The pattern of the striped anode 15 is, for example, formed perpendicular to the pattern of the striped cathode 12. The edges are sealed to form an air-tight vacuum around the device, thereby finally completing the device.

The inside of the device, as shown in FIG. 4E, is at a vacuum of about $10^{-6}$ to $10^{-7}$ torr or below. In operation, a bias voltage is applied to the gate electrode and the cathode is grounded. When an appropriate level of power voltage Va is applied to the anode, a strong electrical field is generated at the diamond tip, thereby emitting electrons. A field emission display, manufactured as described above, can be used in a flat panel display, an ultra-high-frequency-wave-applied device, a scanning electron microscope, or an electron-beam-applied device such as a micro-sensor.

In the manner described above, according to the present invention, electron emitting micro-tips are manufactured using diamond or diamond-like carbon having a low work function owing to their electron affinity, thereby facilitating electron emission at a very low gate voltage. Manufacturing a flat micro-tip allows uniform tips to be formed so that a large device can be easily fabricated.

What is claimed is:

1. A method for fabricating a field emission display comprising the steps of:

forming a cathode pattern on a substrate;

forming a amorphous silicon layer on said cathode pattern;

forming a thin film of a material having a work function below a value on said amorphous silicon layer;

forming a mask layer on said thin film and etching and patterning said mask layer to form a mask;

isotropically etching said thin film using said mask to form a tip;

etching said amorphous silicon layer to form a tip pedestal;

depositing insulation material around said tip pedestal;

depositing a metal on said insulating layer to form a gate layer; and etching the mask to remove portions of said insulation material and said gate layer deposited on said tip.

2. A method for fabricating a field emission display as claimed in claim 1, wherein said thin film is formed of a diamond-like carbon.

3. A method for fabricating a field emission display as claimed in claim 1, wherein said thin film is formed by depositing a diamond on said amorphous silicon layer and said tip is a diamond tip.

4. A method for fabricating a field emission display as claimed in claim 1, wherein said amorphous silicon layer forming step is performed by an electron beam deposition method.

5. A method for fabricating a field emission display as claimed in claim 1, wherein said amorphous silicon layer forming step is performed by a sputtering method.

6. A method for fabricating a field emission display as claimed in claim 1, wherein said thin film forming step is performed by a plasma enhanced chemical vapor deposition method.

7. A method for fabricating a field emission display as claimed in claim 2, wherein said diamond-like carbon film forming step is performed by a plasma enhanced chemical vapor deposition method.

8. A method for fabricating a field emission display as claimed in claim 1, wherein said mask forming step is performed by a lift-off method.

9. A method for fabricating a field emission display as claimed in claim 1, wherein said mask forming step is performed by a chemical etching method.

10. A method for fabricating a field emission display as claimed in claim 1, wherein a $SF_6$—$O_2$ plasma is used in said isotropically etching step.

11. A method for fabricating a field emission display as claimed in claim 1, wherein said tip pedestal forming step comprises the steps of isotropically etching said amorphous silicon layer using $SF_6$—$O_2$ plasma and anisotropically etching said amorphous silicon layer using $CF_4$—$O_2$ plasma.

12. A method for fabricating a field emission display as claimed in claim 1, wherein said insulating layer forming step is performed using an electron-beam deposition method adopting a self-aligned mask.

13. A method for fabricating a field emission display as claimed in claim 1, wherein said mask is removed by soaking the mask in a metal chemical etchant solution and applying ultrasonic vibration thereto.

14. A method for fabricating a field emission display as claimed in claim 1, further comprising a step of etching said insulating layer using a buffered oxide etchant after said mask etching step.

* * * * *